United States Patent
Shah et al.

(10) Patent No.: US 6,222,393 B1
(45) Date of Patent: *Apr. 24, 2001

(54) APPARATUS AND METHOD FOR GENERATING A PULSE SIGNAL

(75) Inventors: Shailesh Shah; Gregory J. Landry, both of San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/357,474

(22) Filed: Jul. 20, 1999

(51) Int. Cl.[7] .................................................. H03K 5/00
(52) U.S. Cl. .......................... 327/34; 327/551; 327/36; 327/261; 327/263; 327/267
(58) Field of Search .................................... 327/143, 170, 327/172, 34, 36, 261, 263, 276

(56) References Cited

U.S. PATENT DOCUMENTS

| | | | |
|---|---|---|---|
| 4,272,832 | 6/1981 | Ito | 372/94 |
| 4,286,174 | 8/1981 | Dingwall | 327/55 |
| 4,355,377 | 10/1982 | Sud et al. | 326/98 |
| 4,767,947 | 8/1988 | Shah | 327/176 |
| 4,985,643 | 1/1991 | Proebsting | 326/17 |
| 5,003,513 | 3/1991 | Porter et al. | 327/208 |
| 5,039,875 | 8/1991 | Chang | 327/143 |
| 5,124,573 | * 6/1992 | Wong | 327/172 |
| 5,151,614 | 9/1992 | Yamazaki et al. | 327/143 |
| 5,163,168 | 11/1992 | Hirano et al. | 327/176 |
| 5,172,012 | 12/1992 | Ueda | 327/143 |
| 5,177,375 | 1/1993 | Ogawa et al. | 327/143 |
| 5,218,237 | 6/1993 | Mao | 430/378 |
| 5,306,958 | 4/1994 | Reddy et al. | 327/14 |
| 5,321,317 | 6/1994 | Pascucci et al. | 327/143 |
| 5,343,082 | 8/1994 | Han et al. | 327/34 |
| 5,438,550 | 8/1995 | Kim | 327/143 |
| 5,590,089 | 12/1996 | Roohparvar | 365/233.5 |
| 5,933,032 | * 8/1999 | Shah et al. | 327/34 |

FOREIGN PATENT DOCUMENTS

| | | |
|---|---|---|
| 60-85498 | 5/1985 | (JP) . |
| 4-129416 | 4/1992 | (JP) . |

OTHER PUBLICATIONS

National Semiconductor Corporation, Wendell, Dennis, et al., "A 3.5ns, 2K×9 Self Timed SRAM", *IEEE*, 1990 Symposium on VLSI Circuits, pp. 49–50.

Bonges, Henry, et al., "A 576K 3.5ns Access BiCMOS ECL Static RAM with Array Built–in Self–Test", *IEEE*, 1992.

Chappell, Terry I., et al., "A 2–ns Cycle, 3.8–ns Access 512–KB CMOS ECL SRAM with a Fully Pipelined Architecture", *IEEE Journal of Solid–State Circuits*, vol. 26, No. 11, Nov. 1991.

Childs, Larry F., "An 18 ns 4K×4 DMOS SRAM", *IEEE Journal of Solid–State Circuits*, vol. SC–19., No. 5., Oct. 1984, pp. 545–551.

(List continued on next page.)

*Primary Examiner*—Dinh T. Le
(74) *Attorney, Agent, or Firm*—Wagner, Murabito & Hao LLP

(57) ABSTRACT

A circuit for generating a pulse signal in response to an input signal. The circuit provides a pulse width for the pulse signal. A first logic device receives the input signal and generates a first intermediate signal. A delay device is coupled to the first logic device and receives the first intermediate signal. The delay device generates a second intermediate signal in response to the first intermediate signal after a period of time. The second intermediate signal has the same state as the second intermediate signal. A second logic device is coupled to both the first logic device and the delay device. The second logic device generates the pulse signal in response to the first intermediate signal.

4 Claims, 7 Drawing Sheets

OTHER PUBLICATIONS

Flannagan, Stephen T., et al., "Two 13-ns 64K CMOS SRAM's with Very Low Active Power and Improved Asynchronous Circuit Techniques", *IEEE Journal of Solid-State Circuits*, vol. SC-21, No. 5, Oct. 1986, pp. 692–703.

Williams, Todd, et al., "An Experimental 1-Mbit CMOS SRAM with Configurable Organization and Operation", IEEE Journal of Solid-State Circuits, vol. 23, No. 5, Oct. 1988, pp. 1085–1093.

* cited by examiner

APPARATUS AND METHOD FOR GENERATING A PULSE SIGNAL

BACKGROUND OF THE INVENTION

1. Field of the Invention

The present invention relates to a signal generation circuit. More specifically, a circuit for generating a pulse signal in response to an input signal.

2. Background

Self-timed circuits require a mechanism for internally generating a pulse signal. Often, stringent timings specifications are required by the self-timed circuits. The required pulse may have a specific active pulse width as well as a specific inactive pulse width.

Conventional pulse generation circuits, such as a one-shot circuit, cannot guarantee a specific pulse width. A typical one-shot circuit receives an external clock signal and generates an output pulse of a fixed width provided that the input signal pulse width is greater than the required output pulse width. However, if the input pulse width is less than the required output pulse width, then the output pulse width will be equal to the input pulse width. Clock signal variations may be caused by a variety of factors external to the one-shot circuit itself. When utilizing this type of one-shot circuit, designers must consider potential variations in the external clock signal and design the circuits receiving the one-shot output signal accordingly. Designing with this type of one-shot circuit may require the use of a larger range of timing signal specifications to allow for variations in the external clock signal.

A known one-shot circuit is illustrated in FIG. 1A. An input line, providing a signal A, is connected to a logic AND gate 14 and a first inverter 10. The output of inverter 10 is connected to a second inverter 11, having an output connected to a third inverter 12. The third inverter has an output connected to AND gate 14. The one-shot circuit provides an output signal C from the AND gate.

FIG. 1B is a timing diagram for the one-shot circuit illustrated in FIG. 1A. This timing diagram represents the situation when the pulse width of signal A is greater than the desired pulse width of output signal C. The rising edge of input signal A generates the rising edge of output signal C after a specific time delay caused by the propagation delay through AND gate 14. Signal B is inverted and delayed from signal A by inverters 10, 11, and 12. The falling edge of signal B generates the falling edge of output signal C, after the propagation delay of AND gate 14. Thus, the pulse width of signal C is determined by the propagation delay through inverters 10–12.

FIG. 1C is another timing diagram for the one-shot circuit illustrated in FIG. 1A. This timing diagram represents the situation when the pulse width of signal A is less than the delay through inverters 10–12. Thus, the pulse width of signal C is determined by the duration of input pulse A, rather than the propagation delay through inverters 10–12.

SUMMARY OF THE INVENTION

The present invention provides a circuit for generating a pulse signal in response to a rising edge of an input signal. The pulse signal has a pulse width determined by components within the circuit itself and does not rely on a falling edge of an external signal to determine the pulse width. Thus, variations in the pulse width of the external signal do not alter the pulse width generated by the inventive circuit. Accordingly, precise timing specifications can be satisfied by utilizing the present invention.

An embodiment of the present invention includes a first logic device to receive the input signal and generate a first intermediate signal. A delay device is coupled to the first logic device and receives the first intermediate signal. The delay device generates a second intermediate signal in response to the first intermediate signal after a period of time. The second intermediate signal has the same state as the first intermediate signal. A second logic device is coupled to both the first logic device and the delay device and generates a pulse signal output in response to the first intermediate signal.

Another feature of the present invention provides several delay elements coupled together in a series relationship. Each delay element provides a particular propagation delay. Another aspect of the invention provides a programmable delay device for providing several possible propagation delays.

Another feature of the present invention provides a second delay device coupled to the first and second logic devices. The first delay device determines the pulse width of the output pulse and the second delay device determines the time required for the input pulse to be inactive, thereby resetting the circuit for another pulse. The second delay device allows the circuit to ignore any "glitches" on the input and filter any "noise."

BRIEF DESCRIPTION OF THE DRAWINGS

The present invention is illustrated by way of example in the following drawings in which like references indicate similar elements. The following drawings disclose various embodiments of the present invention for purposes of illustration only and are not intended to limit the scope of the invention.

DETAILED DESCRIPTION

The following detailed description sets forth numerous specific details to provide a thorough understanding of the present invention. However, those skilled in the art will appreciate that the present invention may be practiced without these specific details. In other instances, well known methods, procedures, components, and circuits have not been described in detail so as not to obscure the present invention.

The present invention is related to a circuit for generating a pulse signal in response to a rising edge of an input signal. The pulse generation circuit provides a pulse signal having a particular pulse width determined by the circuit itself. This circuit is particularly useful with self-timed circuits requiring internal pulse generation and circuits having specific pulse timing requirements. The circuit can be incorporated into an integrated circuit (IC) component to control other circuits within the IC. Although the present invention is described as used with self-timed circuits, skilled artisans will appreciate that the invention can be used with any circuit requiring a pulse signal. In particular, circuits requiring a pulse signal having a specific pulse width.

Figure 1A:
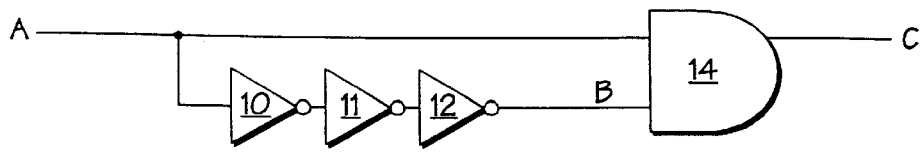
FIG. 1A is a schematic diagram of a prior art one-shot circuit.
Figure 1B:
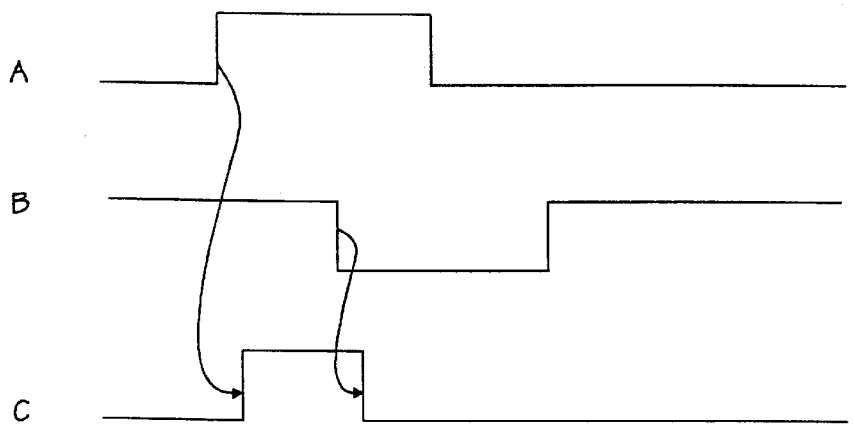
FIG. 1B and 1C are a timing diagrams of the circuit shown in FIG. 1A.
Figure 1C:
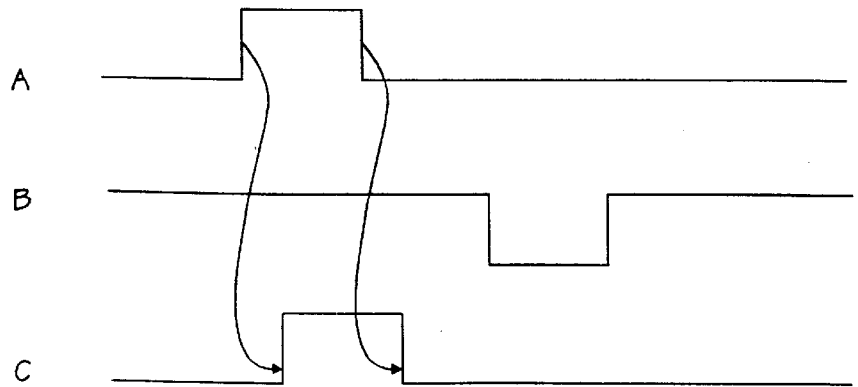
Figure 2:
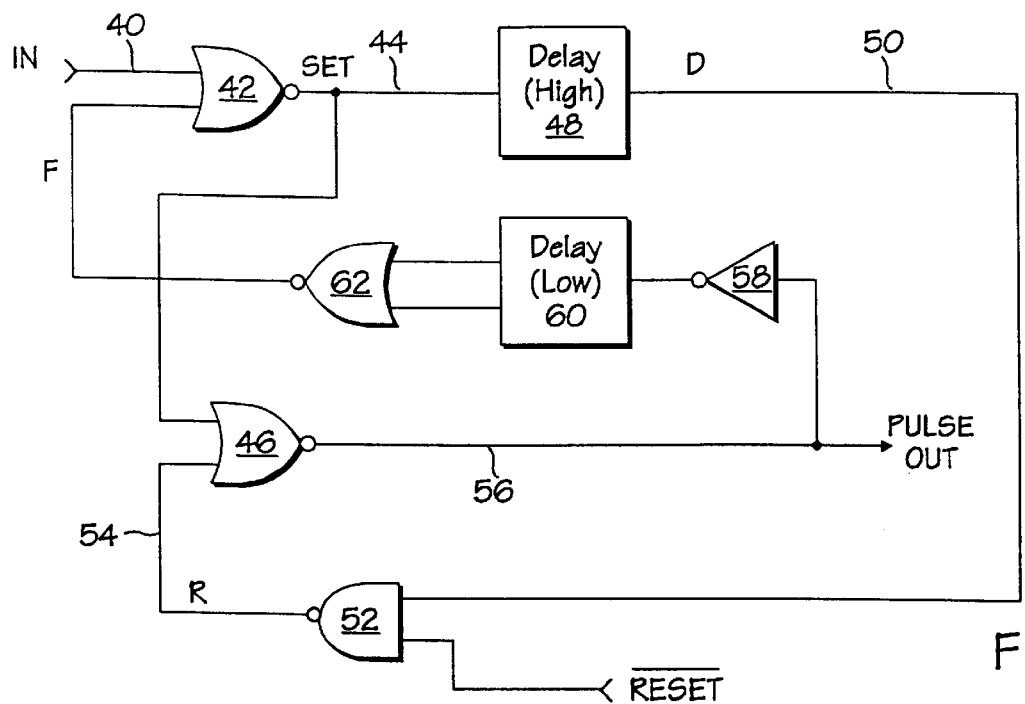
FIG. 2 is a schematic diagram of an embodiment of the present invention.

FIG. 2 is a schematic diagram of an embodiment of the present invention. An external signal IN is received by an input line 40 and provided to a logic NOR gate 42. NOR gate 42 produces an output signal SET on line 44 which is coupled to a second NOR gate 46 and a delay device 48. NOR gates 42 and 46 are cross-coupled such that the output of each NOR gate is coupled to an input of the other NOR gate. This configuration is commonly referred to as an SR latch circuit. As illustrated in FIG. 2, the output of NOR gate 46 is coupled to the input of NOR gate 42 through circuit elements 58, 60, and 62. The latch circuit illustrated in FIG. 2 is set after the propagation of signal IN through NOR gates 42 and 46.

Delay device 48 delays the SET signal received on line 44 and generates an output signal D on line 50. Signal D has the same state as signal SET, but shifted in time by the propagation delay of device 48.

Output line 50 is coupled to a NAND gate 52 having an output line 54 coupled to NOR gate 46. NAND gate 52 also receives a $\overline{\text{RESET}}$ signal and generates an output signal R on line 54. NOR gate 46 generates an output signal PULSE OUT on line 56 for use by a circuit requiring a pulse signal.

Line 56 is also coupled to an inverter 58 having an output coupled to a second delay device 60. The output of delay device 60 is coupled to a NOR gate 62 having an output coupled to NOR gate 42. Delay devices 48 and 60 may be constructed using a variety of circuit elements to provide a specific propagation delay through the device.

The active-low $\overline{\text{RESET}}$ signal connected to NAND gate 52 provides a power-on reset of the pulse generation circuit. However, the use of NAND gate 52 is not required for proper operation of the circuit in FIG. 2. If a power-on reset signal is not necessary for a particular application, NAND gate 52 may be replaced with an inverter to provide the proper signal to NOR gate 46. An inverter may be located outside delay device 48 and connected in the same manner as NAND gate 52 being replaced. Alternatively, the inverter may be located within delay device 48 such that the output of delay device 48 is coupled directly to NOR gate 46.

Those skilled in the art will appreciate that different logic devices may be utilized to practice the present invention. The inventive pulse generation circuit is not limited to the NOR gates and other logic devices illustrated in FIG. 2. In an alternate embodiment of the present invention, a memory cell may replace the latch circuit shown in FIG. 2. This embodiment requires additional circuitry to properly control the operation of the memory cell.

Figure 3:
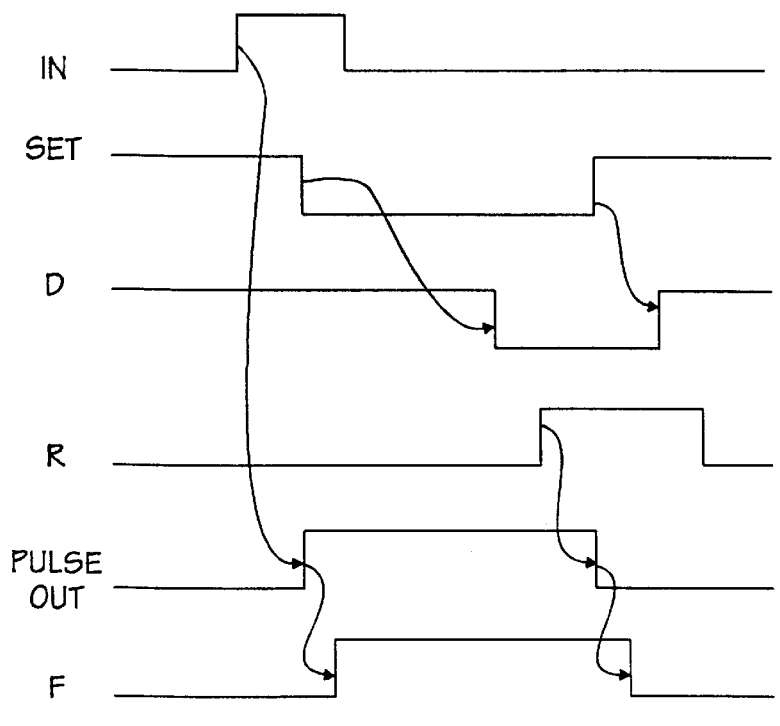
FIGS. 3, 4A and 4B are timing diagrams of the circuit shown in FIG. 2.

FIG. 3 is a timing diagram of the circuit shown in FIG. 2. The input signal provided on line 40 has a sufficient pulse width to set the latch circuit created by NOR gates 42 and 46. As a result, the latch circuit remains set until the SET signal propagates through delay device 48, NAND gate 52, and NOR gate 46. As shown in FIG. 3, the rising edge of signal IN on line 40 causes the SET signal to fall after the propagation delay through NOR gate 42. Signal D represents the delayed SET signal, and signal R on line 54 represents the output from NAND gate 52. The PULSE OUT signal responds to the falling edge of the SET signal after the propagation delay provided by NOR gate 46.

Delay device 48 may be constructed from a variety of different electrical components. For example, a series of inverters may be provided to generate a specific propagation delay. The circuit illustrated in FIG. 2 would require an even number of inverters in delay device 48 to maintain the same state on line 44 and line 50. Other types of gates and devices may be used to provide a propagation delay in device 48. Additional details regarding specific delay circuits are provided below.

Figure 4A:
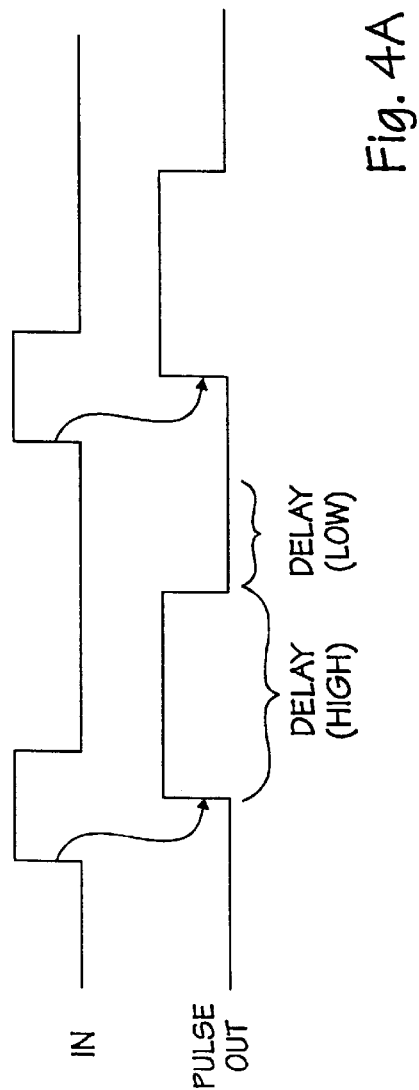
Figure 4B:
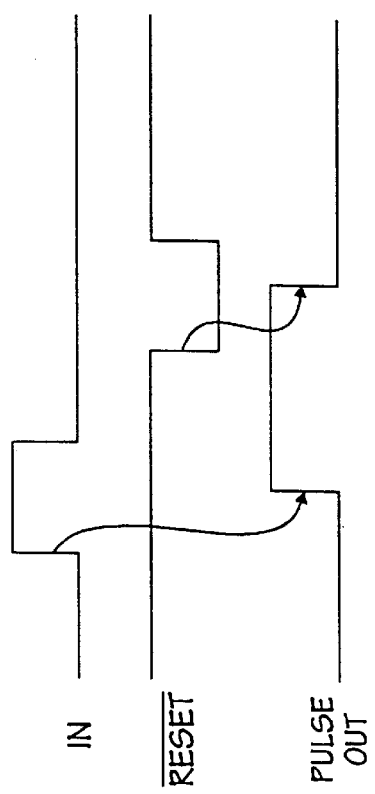

FIGS. 4A and 4B are timing diagrams illustrating the operation of the pulse generation circuit shown in FIG. 2. Referring to FIG. 4A, the rising edge of input signal IN generates a rising edge on the PULSE OUT signal after a propagation delay through NOR gates 42 and 46. An input signal having a specific minimum pulse width will latch the circuit shown in FIG. 2. Once the latch circuit is set, the PULSE OUT signal provided on line 56 will remain active until the latch circuit is reset. The latch circuit cannot be reset until the SET signal has propagated through delay device 48, NAND gate 52, and NOR gate 46. Therefore, the active pulse width of PULSE OUT is determined by the known propagation delay through device 48, NAND gate 52, and NOR gate 46. Since the propagation delay through these devices is known, the active pulse width can be adjusted by varying the delay through device 48.

As illustrated in FIG. 4A, the falling edge of signal IN does not alter the PULSE OUT signal. Similarly, a second rising edge on signal IN will not change the PULSE OUT signal until the latch circuit is reset.

FIG. 4A illustrates a minimum inactive pulse width after the falling edge of PULSE OUT. This inactive pulse width is produced by delay device 60 which ensures that the PULSE OUT signal will remain low during the propagation delay of inverter 58, delay device 60, and NOR gate 62. Thus, the latch circuit is not fully reset until the falling edge of the PULSE OUT signal arrives at NOR gate 42. At that point, PULSE OUT remains low until the next rising edge of signal IN is received by NOR gate 42. In a preferred implementation of the invention, the latch circuit is reset shortly before a rising edge on signal IN arrives at NOR gate 42.

Referring the FIG. 4B, operation of the circuit utilizing the $\overline{\text{RESET}}$ signal is illustrated. The $\overline{\text{RESET}}$ signal is active-low, and functions to reset the latch circuit regardless of the current state of the PULSE OUT signal. The $\overline{\text{RESET}}$ signal is useful during initialization of the circuit to ensure that the latch circuit is reset to a known state. The falling edge of the $\overline{\text{RESET}}$ signal forces signal PULSE OUT to an inactive state after propagating through NAND gate 52 and NOR gate 46. As mentioned above, NAND gate 52 and the associated $\overline{\text{RESET}}$ signal are not required for proper operation of the invention.

In summary, the active pulse width of PULSE OUT is determined by delay device 48, while the minimum inactive pulse width of PULSE OUT is determined by delay device 60. Delay device 60 also allows the circuit to ignore any "glitches" in the input signal, thereby filtering out "noise" in the input signal. Since two different delay devices are provided, the active and inactive pulse widths can be adjusted independently of one another. Furthermore, the pulse widths can be established with a high degree of precision because all delay components are contained within the circuit. By selecting components with precise propagation delays, pulse signals having specific characteristics can be generated. Additionally, since active and inactive pulse widths are determined by the components of the circuit itself, external factors affecting the input signal pulse width will not change the PULSE OUT characteristics.

Figure 5:
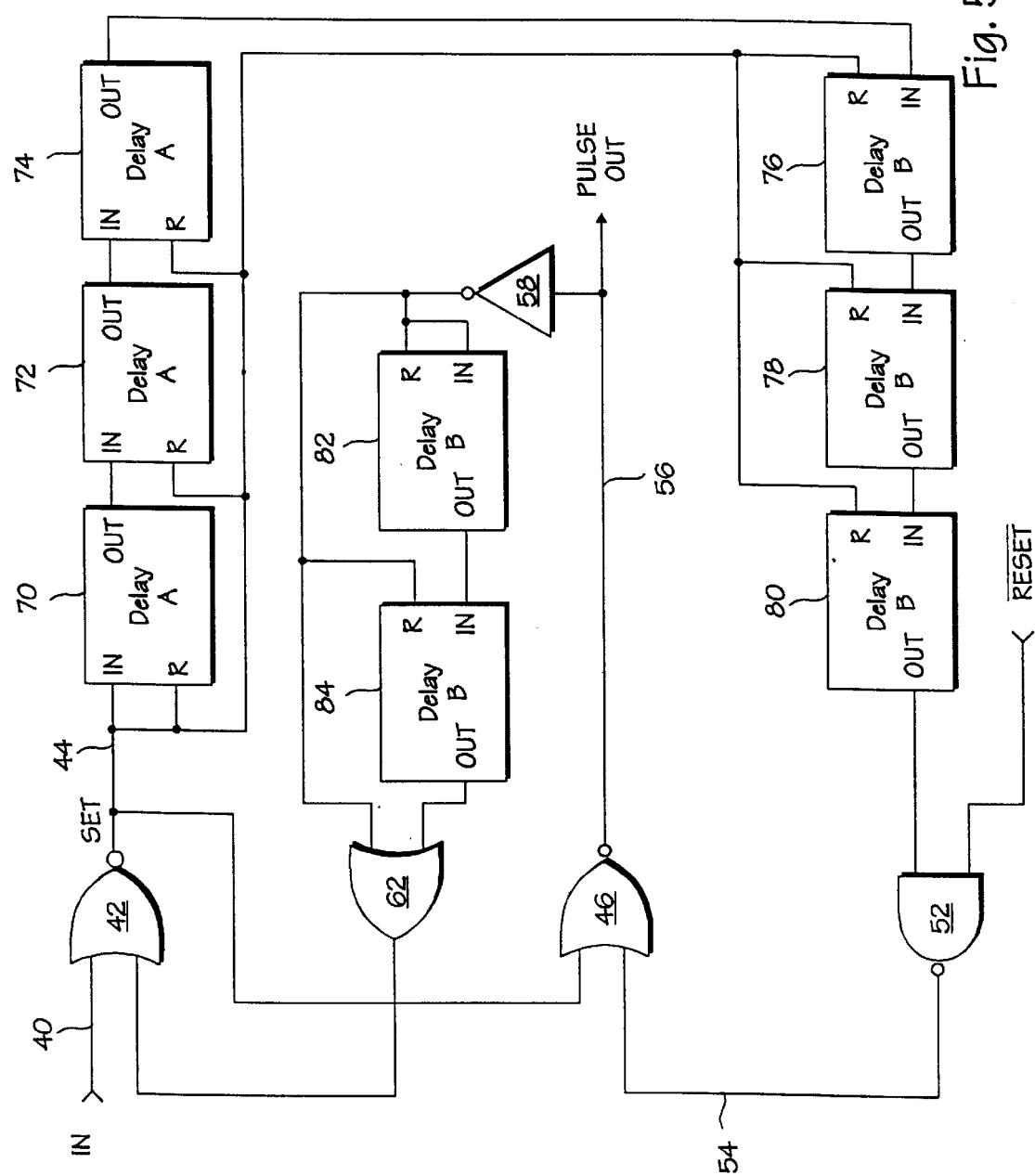
FIG. 5 is a detailed schematic diagram of the embodiment illustrated in FIG. 2.

FIG. 5 illustrates the circuit of FIG. 2 with additional details regarding delay devices 48 and 60. Delay device 48 is replaced by a series of delay elements 70–80. Similarly, delay device 60 is replaced by a pair of delay elements 82 and 84. As discussed above, the number of delay elements utilized is variable depending on the desired pulse duration. Two different types of delay elements are illustrated in FIG. 5. A first type of delay element, labeled delay A, is used for delay elements 70, 72, and 74. A second type of delay element, labeled delay B, is used for the remaining delay elements 76–84. Each delay element 70–84 includes a pair of inputs, labeled IN and Reset, and an output, labeled OUT. The signal provided on OUT is the same as signal IN delayed by the propagation delay through the delay element.

Figure 6:
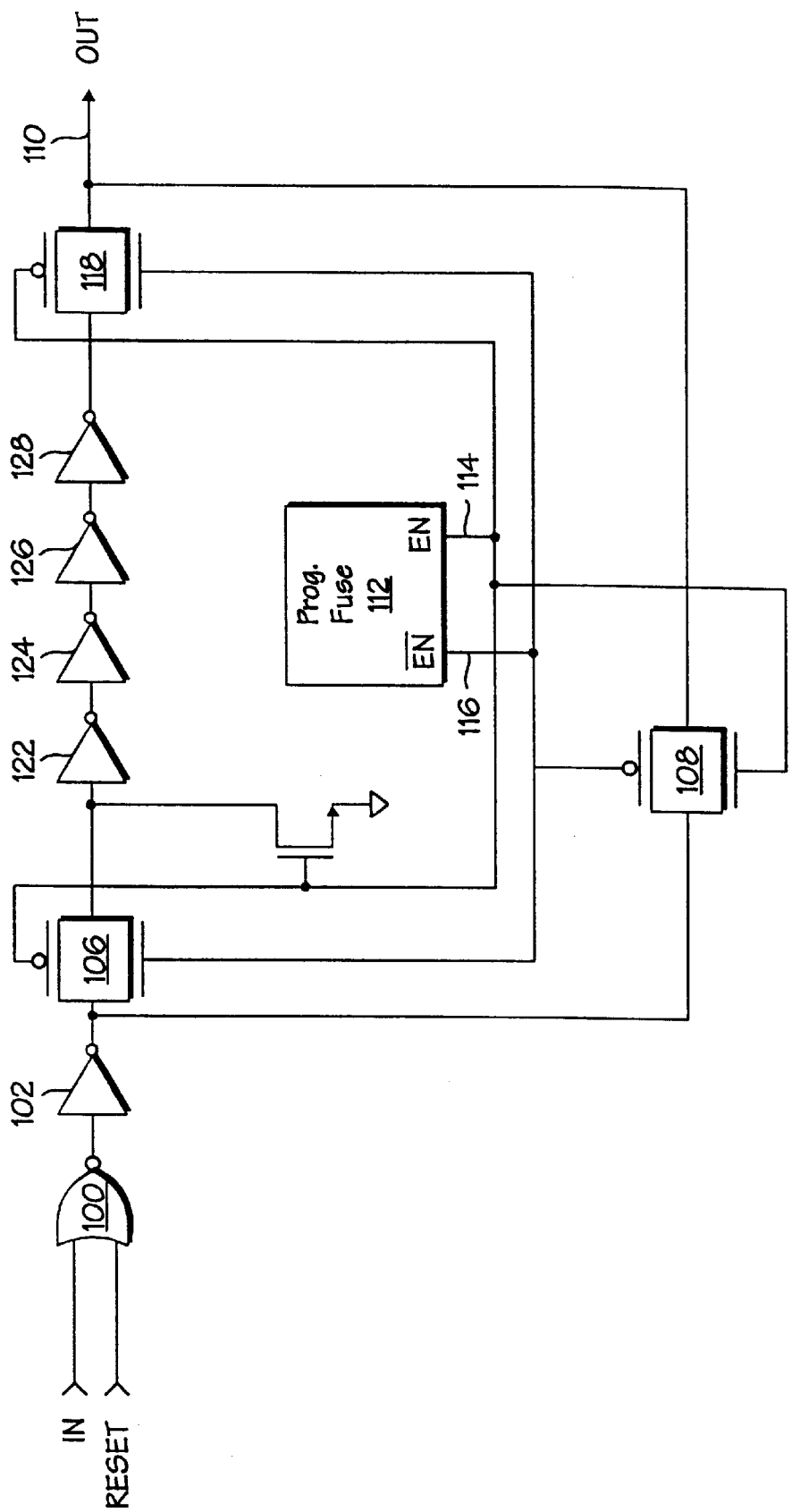
FIG. 6 is a detailed diagram of a first type of delay device.

FIG. 6 provides a detailed illustration of the first type of delay element, delay A. A two-input NOR gate 100 receives signals IN and RESET. The output of NOR gate 100 is coupled to an inverter 102 having an output coupled to a pair of transmission gates 106 and 108. A programmable fuse 112 provides an enable signal on line 114 and an inverted enable signal on line 116. If fuse 112 is not blown, then enable line 114 is high and inverted enable line 116 is low. This situation causes transmission gates 106 and 118 to be deactivated while transmission gate 108 is activated. Therefore, input signal IN flows through transmission gate 108 to an output line 110, bypassing inverters 122–128. In this case, the only delay through the delay element occurs through NOR gate 100, inverter 102, and transmission gate 108.

If fuse 112 in FIG. 6 is blown, then enable line 114 is low and inverted enable line 116 is high. In this situation, transmission gate 108 is deactivated and transmission gates 106 and 118 are activated, causing input signal IN to flow from inverter 102 through transmission gate 106 to inverters 122–128. From inverter 128, the signal flows through transmission gate 118 to output line 110. Therefore, the propagation delay through the delay element is increased due to the additional propagation delay through the four inverters and one additional transmission gate.

In a specific embodiment of the invention, each delay element 70–74 is capable of providing two different propagation delays. If programmable fuse 112 is not blown, then the propagation delay through the delay element is 400 picoseconds. If programmable fuse 112 is blown, the propagation delay through the delay element increases to 800 picoseconds.

Figure 7:
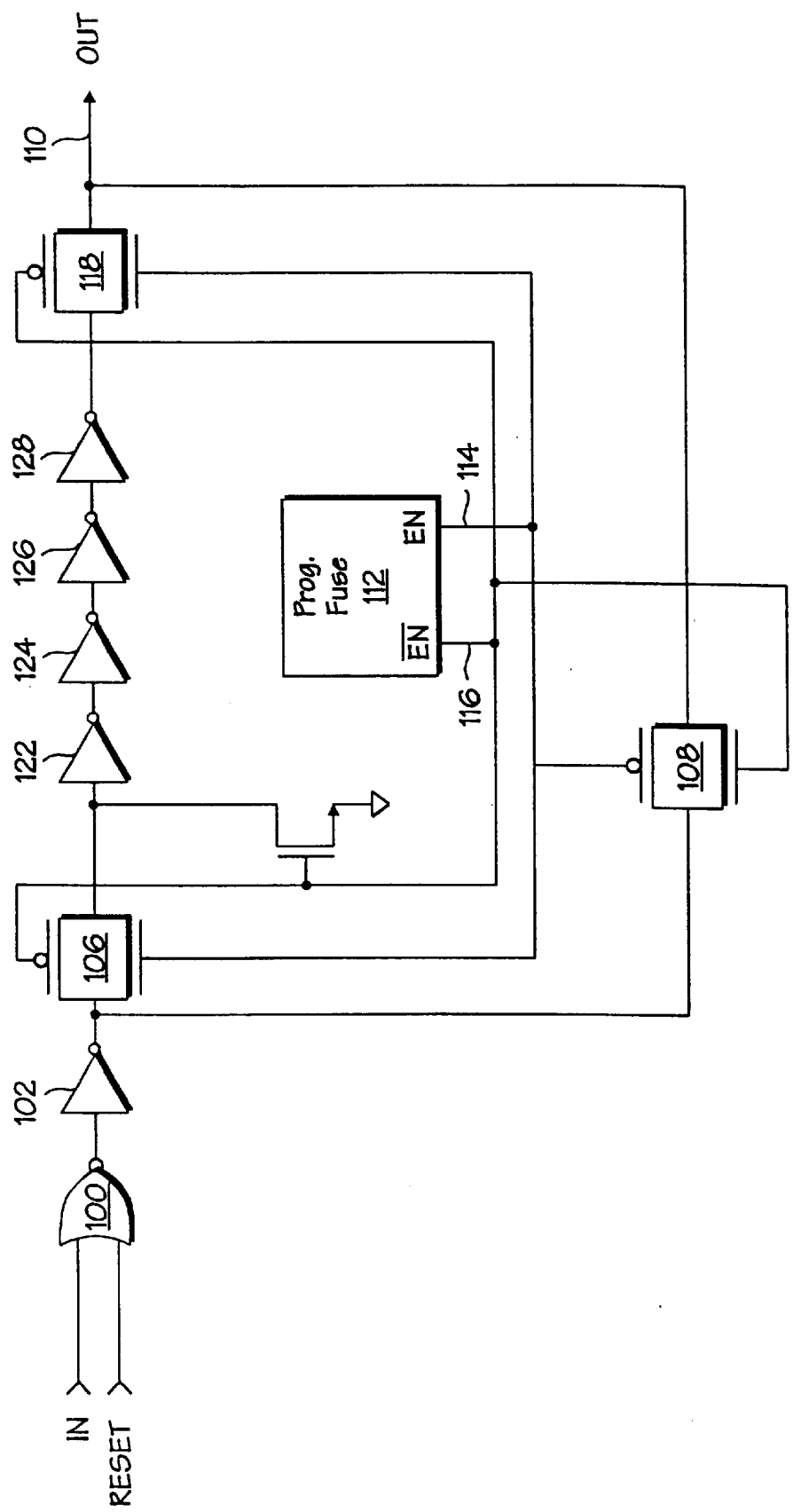
FIG. 7 is a detailed diagram of a second type of delay device.

Referring to FIG. 7, a second type of delay element, delay B, is illustrated. This delay element is similar to the device shown in FIG. 6, but provides a different connection between programmable fuse 112 and transmission gates 106, 108, and 118. Specifically, the connections of enable line 114 and inverted enable line 116 are reversed. Thus, if programmable fuse 112 is not blown, then enable line 114 is high and inverted enable line 116 is low. In this case, transmission gate 108 is deactivated and transmission gates 106 and 118 are activated, causing input signal IN to flow from inverter 102 through transmission gate 106 to inverters 122–128. From inverter 128, the signal flows through transmission gate 118 to output line 110.

If programmable fuse 112 is blown, then enable line 114 is low and inverted enable line 116 is high. This situation activates transmission gate 108 and deactivates transmission gates 106 and 118, causing input signal IN to bypass inverters 122–128.

Programmable fuse 112 in each delay element 70–84 may be blown independently of any other fuses. Therefore, various propagation delays can be produced by selecting different combinations of blown and unblown fuses in the delay elements.

Although a particular number of delay elements 70–84 are shown and described, it will be understood that any number of delay elements may be used depending on the desired pulse signal characteristics. Similarly, a particular number of inverters 122–128 are shown in each delay element. Those skilled in the art will appreciate that any number of inverters or other delay devices may be used to generate the desired pulse signal characteristics.

In another embodiment of the present invention, a constant reference voltage may be provided in each delay device for maintaining a constant voltage to compensate for variations in temperature, process, and supply voltage. This constant reference voltage provides greater precision in the propagation delay of the delay device.

Figure 8:
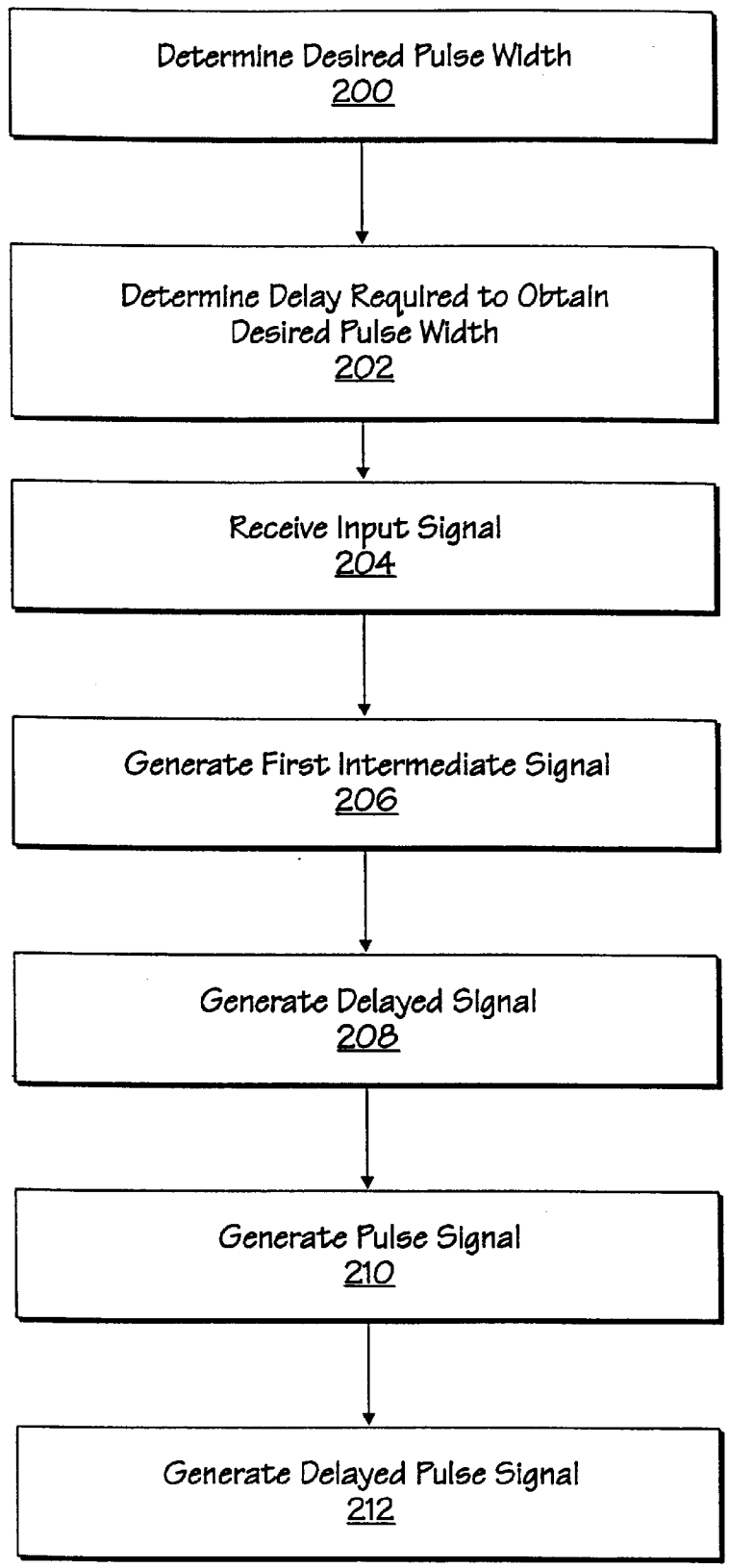
FIG. 8 is a flow chart illustrating operation of the present invention.

Referring to FIG. 8, the overall operation of the circuit shown in FIG. 2 is described. At step 200, the pulse width for the desired output signal is determined. The desired active pulse width and inactive pulse width are dependent on the requirements of the circuit receiving the pulse signal. At step 202, a calculation is performed to determine the delay required in the circuit to produce the corresponding desired pulse width. This calculation involves determining the delay characteristics of each delay element in both a blown and unblown fuse condition. Next, appropriate combinations of delay elements are selected to provide the required active pulse width and inactive pulse width.

At step 204, the input signal IN is received by the pulse generation circuit. A first intermediate signal is generated at step 206 followed by a delayed signal generated at step 208. At step 210, a pulse output signal is generated followed by the generation of a delayed pulse signal at step 212. The pulse output signal generated at step 210 corresponds to the PULSE OUT signal.

From the above description and drawings, it will be understood by those skilled in the art that the particular embodiments shown and described are for purposes of illustration only and are not intended to limit the scope of the invention. Those skilled in the art will recognize that the invention may be embodied in other specific forms without departing from its spirit or essential characteristics. References to details of particular embodiments are not intended to limit the scope of the claims.

What is claimed is:

1. A circuit for generating a pulse signal comprising:
   a first circuit configured to generate a first state of the pulse signal in response to a transition of an input signal from a first input signal state to a second input signal state; and
   a second circuit coupled to the first circuit, the second circuit coupling the pulse signal to the first circuit after a first programmable amount of time, said first circuit configured to generate the first state of the pulse signal for at least a second programmable amount of time when the input signal remains in the second input signal state for at least the first programmable amount of time.

2. The circuit of claim 1, wherein a second state of the pulse signal has a minimum duration of the first programmable amount of time.

3. The circuit of claim 1, wherein the second circuit prevents the first circuit from generating another pulse signal during the first programmable amount of time.

4. The circuit of claim 1, wherein the second circuit comprises a programmable delay device.

* * * * *